(12) United States Patent
Turner et al.

(10) Patent No.: US 9,673,341 B2
(45) Date of Patent: Jun. 6, 2017

(54) PHOTOVOLTAIC DEVICES WITH FINE-LINE METALLIZATION AND METHODS FOR MANUFACTURE

(71) Applicant: TetraSun, Inc., San Jose, CA (US)

(72) Inventors: Adrian Bruce Turner, Palo Alto, CA (US); Bonneville Dudgeon Eggleston, Penang (MY); Oliver Schultz-Wittmann, Sunnyvale, CA (US); Douglas Edward Crafts, Los Gatos, CA (US)

(73) Assignee: TETRASUN, INC., San Jose, CA (US)

( * ) Notice: Subject to any disclaimer, the term of this patent is extended or adjusted under 35 U.S.C. 154(b) by 0 days.

(21) Appl. No.: 14/707,697

(22) Filed: May 8, 2015

(65) Prior Publication Data

US 2016/0329440 A1    Nov. 10, 2016

(51) Int. Cl.
| | |
|---|---|
| *H01L 27/142* | (2014.01) |
| *H01L 31/02* | (2006.01) |
| *H01L 31/0216* | (2014.01) |
| *B23K 26/073* | (2006.01) |
| *B23K 26/402* | (2014.01) |
| *H01L 31/0224* | (2006.01) |

(52) U.S. Cl.
CPC ...... *H01L 31/02008* (2013.01); *B23K 26/073* (2013.01); *B23K 26/402* (2013.01); *H01L 31/02168* (2013.01); *H01L 31/022425* (2013.01)

(58) Field of Classification Search
CPC .................................................. H01L 27/142
See application file for complete search history.

(56) References Cited

U.S. PATENT DOCUMENTS

| | | | |
|---|---|---|---|
| 3,922,774 A | | 12/1975 | Lindmayer et al. |
| 3,974,323 A | * | 8/1976 | Brouillette ............... B05D 7/16 252/390 |
| 4,152,824 A | | 5/1979 | Gonsiorawski |
| 4,240,842 A | | 12/1980 | Lindmayer |
| 4,331,703 A | | 5/1982 | Lindmayer |

(Continued)

FOREIGN PATENT DOCUMENTS

| | | |
|---|---|---|
| JP | 1981-164583 A | 12/1981 |
| JP | Hei 4-302480 A | 10/1992 |

(Continued)

OTHER PUBLICATIONS

Shultz-Wittman et al., Examination Report No. 2 for Australian Application No. AU2010-239265, dated Jan. 22, 2014 (3 pages).

(Continued)

*Primary Examiner* — Mohammad Choudhry
(74) *Attorney, Agent, or Firm* — Heslin Rothenberg Farley & Mesiti P.C.; Victor A. Cardona, Esq.

(57) ABSTRACT

A method for use in forming a photovoltaic device includes forming a doped semiconductor layer on a surface of a semiconductor substrate and forming a metal film on the doped semiconductor layer. A patterned etched resist is formed on the metal film and a dielectric layer is formed on the doped semiconductor layer and the etched resist. A laser having a wavelength absorbable by the patterned etch resist is applied through the dielectric layer to the patterned etch resist to remove the patterned etch resist.

15 Claims, 16 Drawing Sheets

(56) References Cited

U.S. PATENT DOCUMENTS

| | | | |
|---|---|---|---|
| 4,435,610 A | 3/1984 | Perlman et al. | |
| 4,451,554 A | 5/1984 | Kishi et al. | |
| 4,451,969 A | 6/1984 | Chaudhuri | |
| 4,612,698 A | 9/1986 | Gonsiorawski et al. | |
| 4,751,191 A | 6/1988 | Gonsiorawski et al. | |
| 5,010,040 A | 4/1991 | Vayman | |
| 5,011,565 A | 4/1991 | Dube et al. | |
| 5,011,567 A | 4/1991 | Gonsiorawski et al. | |
| 5,178,725 A * | 1/1993 | Takeno | B23K 15/08 216/101 |
| 5,181,968 A | 1/1993 | Nath et al. | |
| 5,320,684 A | 6/1994 | Amick et al. | |
| 5,665,607 A | 9/1997 | Kawama et al. | |
| 5,698,451 A | 12/1997 | Hanoka | |
| 5,766,964 A | 6/1998 | Rohatgi et al. | |
| 5,888,859 A * | 3/1999 | Oku | H01L 21/28587 257/E21.314 |
| 6,194,763 B1 | 2/2001 | Hisamoto et al. | |
| 6,210,991 B1 | 4/2001 | Wenham et al. | |
| 6,221,693 B1 | 4/2001 | Ho | |
| 6,365,325 B1 | 4/2002 | Chiang et al. | |
| 6,387,600 B1 | 5/2002 | Hanson | |
| 6,441,298 B1 | 8/2002 | Thio | |
| 6,759,181 B2 | 7/2004 | Hanson | |
| 6,821,875 B2 | 11/2004 | Wenham et al. | |
| 6,924,179 B2 | 8/2005 | Oh et al. | |
| 7,001,710 B2 | 2/2006 | Choi et al. | |
| 7,202,143 B1 | 4/2007 | Naseem et al. | |
| 7,375,378 B2 | 5/2008 | Manivannan | |
| 7,429,446 B2 | 9/2008 | Sawada et al. | |
| 7,547,569 B2 | 6/2009 | Weidman et al. | |
| 7,578,048 B2 | 8/2009 | Wollach et al. | |
| 7,897,867 B1 | 3/2011 | Mulligan et al. | |
| 7,989,346 B2 | 8/2011 | Letize et al. | |
| 7,992,293 B2 | 8/2011 | Carmi | |
| 8,236,604 B2 | 8/2012 | Schultz-Wittmann et al. | |
| 2002/0086244 A1 | 7/2002 | Hanson | |
| 2003/0127128 A1 | 7/2003 | Fabick et al. | |
| 2003/0136440 A1 | 7/2003 | Machida et al. | |
| 2003/0157439 A1 | 8/2003 | Hanson | |
| 2003/0221718 A1 | 12/2003 | Kubo et al. | |
| 2005/0067378 A1* | 3/2005 | Fuerhaupter | C23F 1/18 216/34 |
| 2005/0172996 A1 | 8/2005 | Hacke et al. | |
| 2005/0194037 A1 | 9/2005 | Asai | |
| 2006/0211187 A1* | 9/2006 | Choi | H01L 21/28123 438/197 |
| 2006/0213548 A1 | 9/2006 | Bachrach et al. | |
| 2007/0049047 A1 | 3/2007 | Fujimoto et al. | |
| 2007/0226994 A1 | 10/2007 | Wollach et al. | |
| 2007/0295399 A1 | 12/2007 | Carlson | |
| 2008/0001169 A1 | 1/2008 | Lochtefeld | |
| 2008/0072959 A1 | 3/2008 | Chen et al. | |
| 2008/0311359 A1 | 12/2008 | Satoh et al. | |
| 2008/0311697 A1 | 12/2008 | Reber | |
| 2009/0032095 A1 | 2/2009 | Schultz et al. | |
| 2009/0081823 A1 | 3/2009 | Meeus et al. | |
| 2009/0131274 A1 | 5/2009 | Pison et al. | |
| 2009/0142880 A1 | 6/2009 | Weidman et al. | |
| 2009/0162972 A1 | 6/2009 | Xu et al. | |
| 2009/0165296 A1 | 7/2009 | Carmi | |
| 2009/0178711 A1 | 7/2009 | Joo et al. | |
| 2009/0235972 A1 | 9/2009 | Fukushima et al. | |
| 2009/0239331 A1 | 9/2009 | Xu et al. | |
| 2009/0269558 A1 | 10/2009 | Himmelhaus et al. | |
| 2009/0293268 A1 | 12/2009 | Carmi | |
| 2009/0305457 A1 | 12/2009 | Lin et al. | |
| 2010/0018574 A1 | 1/2010 | Kwon et al. | |
| 2010/0025683 A1 | 2/2010 | Cheng | |
| 2010/0080954 A1 | 4/2010 | Mohseni | |
| 2010/0105190 A1 | 4/2010 | Ferre i Thomas | |
| 2010/0119717 A1 | 5/2010 | Hong et al. | |
| 2010/0136768 A1 | 6/2010 | Biro et al. | |
| 2010/0170567 A1 | 7/2010 | Akimoto | |
| 2010/0186807 A1 | 7/2010 | Borden | |
| 2010/0186808 A1 | 7/2010 | Borden | |
| 2010/0227431 A1 | 9/2010 | Rana | |
| 2010/0255430 A1 | 10/2010 | Dammel et al. | |
| 2010/0279454 A1 | 11/2010 | Eickelmann et al. | |
| 2010/0317148 A1 | 12/2010 | Clevenger et al. | |
| 2011/0021023 A1 | 1/2011 | Letize et al. | |
| 2011/0140226 A1 | 6/2011 | Jin et al. | |
| 2011/0240997 A1 | 10/2011 | Rockenberger et al. | |
| 2012/0055547 A1 | 3/2012 | Schultz-Wittmann | |
| 2013/0042913 A1 | 2/2013 | Crafts | |
| 2013/0340823 A1 | 12/2013 | Ong et al. | |
| 2014/0273431 A1 | 9/2014 | Sasagawa | |
| 2015/0017747 A1* | 1/2015 | Lam | H01L 31/02242 438/14 |
| 2015/0027528 A1 | 1/2015 | Turner et al. | |
| 2015/0083213 A1* | 3/2015 | Hardin | H01L 31/02242 136/256 |

FOREIGN PATENT DOCUMENTS

| | | |
|---|---|---|
| JP | 09199738 A | 7/1997 |
| JP | 2000-058885 A | 2/2000 |
| JP | 2000312016 A | 11/2000 |
| JP | 2001093849 A | 4/2001 |
| JP | 2003298078 A | 10/2003 |
| JP | 2006128630 A | 5/2006 |
| JP | 2007194636 A | 8/2007 |
| JP | 2009206469 A | 9/2009 |
| JP | 2009283549 A | 12/2009 |
| JP | 2010502021 A | 1/2010 |
| JP | 2010147102 A | 7/2010 |
| KR | 1020060100108 A | 9/2006 |
| KR | 100790956 B1 | 1/2008 |
| KR | 1020100131203 A | 12/2010 |
| KR | 101161095 B1 | 6/2012 |
| WO | 2007125903 A1 | 11/2007 |
| WO | 2008028625 A2 | 3/2008 |
| WO | 2008115814 A2 | 9/2008 |
| WO | 2014066588 A | 5/2014 |

OTHER PUBLICATIONS

Shultz-Wittman et al., Examination Report No. 3 for Australian Application No. AU2010-239265, dated Mar. 6, 2014 (3 pages).

International Search Report for PCT/US2010/031869 dated Aug. 18, 2010.

Patent Examination Report No. 1, for Australian Patent Application No. 2010-239265, dated Aug. 19, 2013 (4 pages).

Schultz, O. et al., "Deielctric Rear Surface Passivation for Industrial Multicrystalline Silicon Solar Cells", 2006 IEEE 4th World Conference on Photovoltaic Energy Conversion, vol. 1, May 7-12, 2006 (pp. 885-889).

DeWolf, S. et al., "Surface Passivation Properties of Boron-Doped Plasma-Enhanced Chemical Vapor Deposited Hydrogenated Amorphous Silicon Films on P-Type Crystalline Si Substrates", Applied Physics Letters, vol. 88, Issue 2, Jan. 2006 (1 page; Abstract Only).

Tucci, M. et al., "Laser Fired Back Contact for Silicon Solar Cells", Thin Solid Films, vol. 516, Issue 20, Aug. 30, 2008 (1 page; Abstract Only).

International Search Report for PCT/US2011/029911 dated Nov. 28, 2011.

Machine Translation of KR 10-0790956; published Jan. 3, 2008; printed Sep. 10, 2014.

International Search Report for PCT/2013/022674 dated May 16, 2013.

International Search Report for PCT/US2013/066532 dated Mar. 10, 2014.

Written Opinion of the International Searching Authority dated Mar. 10, 2014 for International Application No. PCT/2013/066532.

S. Bau et al., "Application of PECVD-SiC as intermediate layer in crystalline silicon thin-film solar cells", 3rd World Conference on Photovoltaic Energy Conversion (2003).

Notification of Transmittal of the International Search Report and the Written Opinion for PCT/US2011/024857, dated Oct. 19, 2011.

(56) References Cited

OTHER PUBLICATIONS

Rivkin et al., Direct Write Processing for Photovoltaic Cells, 12th Workshop on Crystalline Silicon Solar Cell Materials and Processes, Aug. 2002, pp. 223-226.
Lennon et al., Direct patterned etching of silicon dioxide and silicon nitride dielectric layers by inket printing, Solar Energy Materials and Solar Cells, 93, 2009, pp. 1865-1874.
Kaydanova et al., Direct Write Contacs for Solar Cells, National Renewable Energy Laboratory Conference, 2004, 5 pages.
Hamm et al., Development of a Plated Nickel Seed Layer for Front Side Metalization of Silicon Solar Cells, EU PCSEC Proceedings, 2009, 4 pages.
PCT/ISA/220 and PCT/ISA/201—Notification of Transmittal of the International Search Report and Written Opinion of the International Searching Authority, or the Declaration, for corresponding PCT International Application No. PCT/US2016/031269, mailed on Nov. 28, 2016.
PCT/ISA/237—Written Opinion of the International Searching Authority, for corresponding PCT International Application No. PCT/US2016/031269, mailed on completed on Nov. 17, 2016, and mailed on Nov. 28, 2016.
Gerrit Heinrich, et al., "Non-Linear Absorption of Femtosecond Laser Pulses in a SiNxLayer—Influence of Silicon Doping", Solar Energy Materials and Solar Cells, vol. 120, May 28, 2013, pp. 317-322, XP028775029, ISSN: 0927-0248, DOI: 10.1016/J.SOLMAT.2013.05.004.
English Translation of KR 20100131203 (Application No. KR20090049976.A) to LG Electronics Inc.

\* cited by examiner

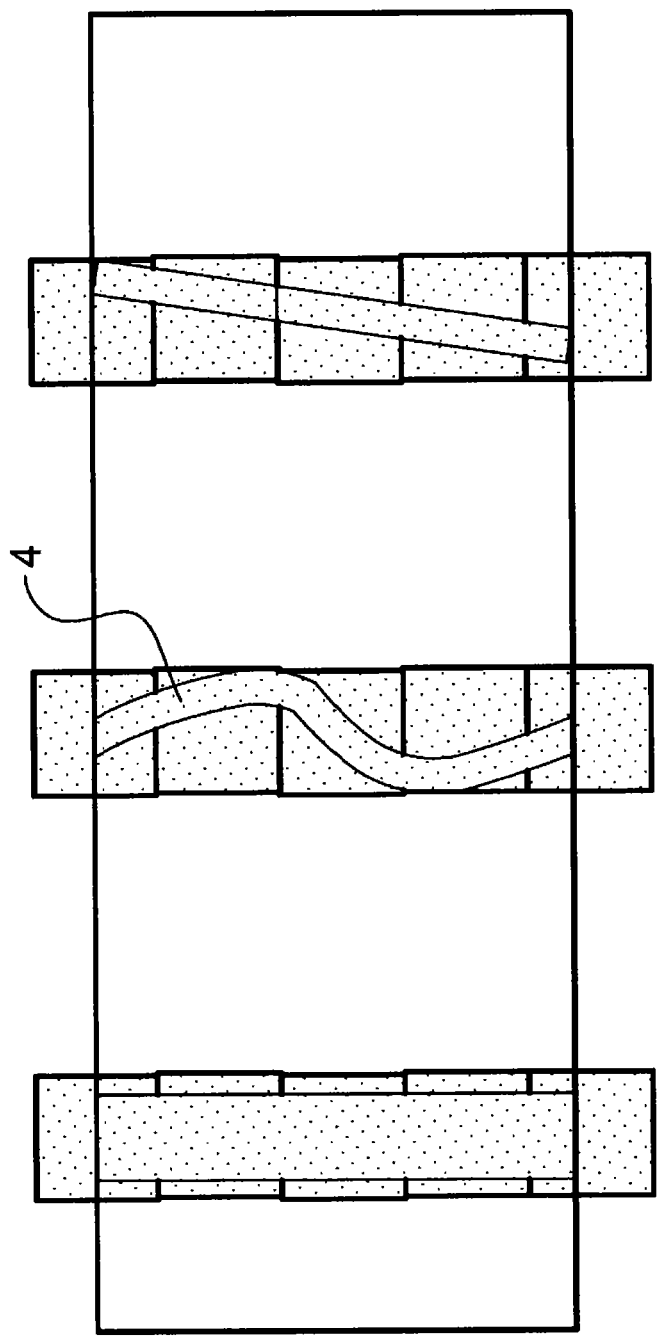

US 9,673,341 B2

PHOTOVOLTAIC DEVICES WITH FINE-LINE METALLIZATION AND METHODS FOR MANUFACTURE

RELATED APPLICATION INFORMATION

This Application is related to U.S. patent application Ser. No. 13/265,462, filed Nov. 15, 2011; U.S. patent application Ser. No. 13/637,176, filed Sep. 25, 2012; U.S. Pat. No. 8,236,604, filed Feb. 15, 2011; U.S. Patent Application No. 61/589,459, filed on Jan. 23, 2012; U.S. Ser. No. 14/373,938, filed Jul. 23, 2014; U.S. Provisional Patent Application No. 61/657,098, filed Jun. 8, 2012; U.S. Ser. No. 61/718,489, filed Oct. 25, 2012; PCT International Application No. PCT/US2013/066532 filed on Oct. 24, 2013, and U.S. patent application Ser. No. 14/707,725, filed on May 8, 2015; which are incorporated herein by reference in their entirety.

FIELD OF THE INVENTION

Disclosed embodiments generally relate to photovoltaic devices which include solar cells and solar modules containing solar cells. More particularly, the disclosed embodiments relate to improved solar cell structures and methods of manufacture for increased cell efficiency.

BACKGROUND

Photovoltaic devices convert photons from incident sunlight into useable electric energy, for example using semiconductor materials deposited over a substrate. The semiconductor layer(s) may be made of an n-type semiconductor material and a p-type semiconductor material. The interaction of an n-type or p-type semiconductor layer with a semiconductor layer of the opposite type creates a p-n junction which facilitates movement of electrons and holes created from absorbed photons via the photovoltaic effect, to produce electric current.

Improved efficiency for photovoltaic conversion, and greater electrical output from solar cells/modules, are desired characteristics of photovoltaic devices.

Accordingly, a need for a high-efficiency photovoltaic device and a method of manufacture arises.

SUMMARY OF THE INVENTION

The present invention provides, in a first aspect, a method for use in forming a photovoltaic device which includes forming a doped semiconductor layer on a surface of a semiconductor substrate and forming a metal film on the doped semiconductor layer. A patterned etched resist is formed on the metal film and a dielectric layer is formed on the doped semiconductor and the etch resist. A laser having a wavelength absorbable by the patterned etch resist is applied through the dielectric layer to the patterned etch resist to remove the patterned etch resist.

BRIEF DESCRIPTION OF THE DRAWINGS

FIG. 3 shows the metal contact deposited on a substrate of the cell;

FIG. 4 shows a narrow resist dispensed over the metal film of the cell;

FIG. 5 shows the metal contact etched except for a portion thereof covered by a resist;

FIG. 6 shows a single, dual-function passivation/antireflection layer formed over the cell of FIG. 5;

FIG. 7 shows a laser removing the resist and a portion of the passivation/antireflection layer of FIG. 6 to leave the contact and portions of the single, dual-function passivation/antireflection layer;

FIG. 8 shows an electrical contact formed on the remaining metal contact;

FIG. 9 shows an embodiment of a manufacturing process for forming the device of FIGS. 1-8, in flowchart form;

FIG. 10 is a planar view showing an example of an electrode configuration;

FIGS. 15 and 16 show examples of how a square top-hat beam profile may be scanned or translated over a substrate, in a process for the self-aligned selective laser ablation of dielectric coating overlying a patterned metal film, in accordance with the present invention.

DETAILED DESCRIPTION

Figure 1:
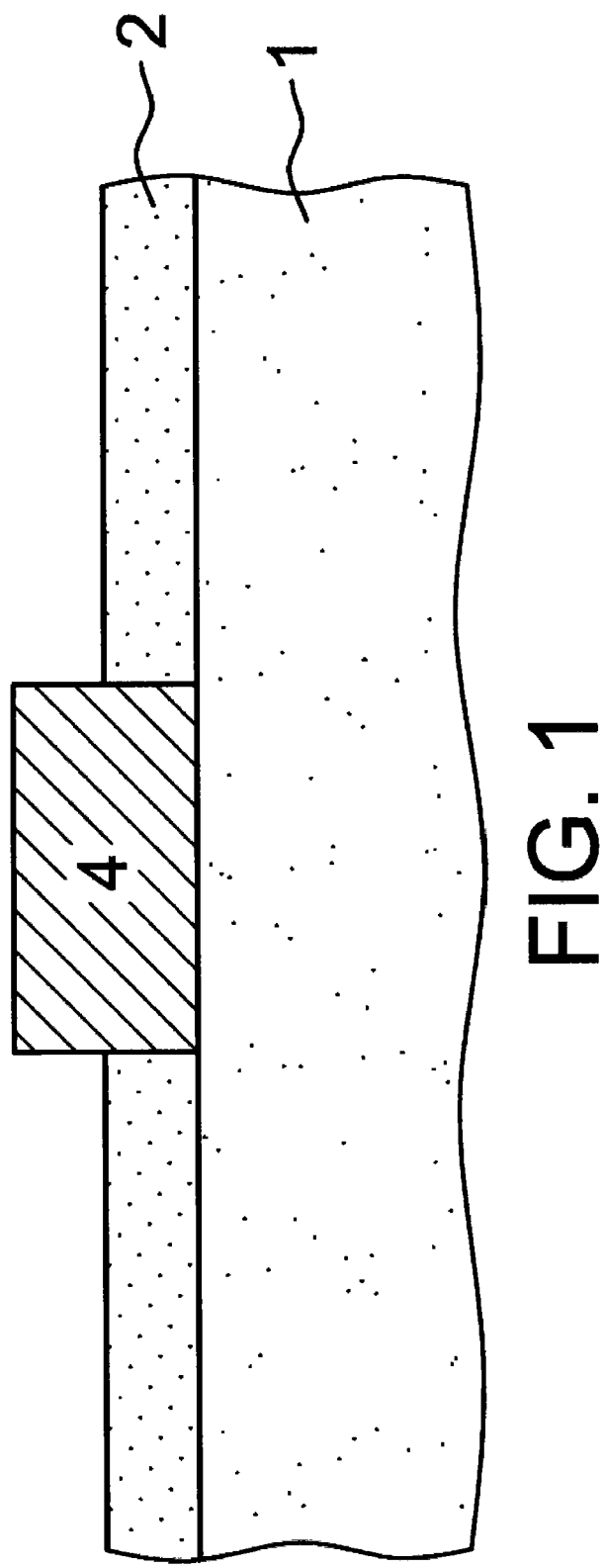
FIG. 1 is a schematic, partial cross-sectional view of a solar cell, with an optimized front contact structure for a high-efficiency solar cell.
Figure 2:
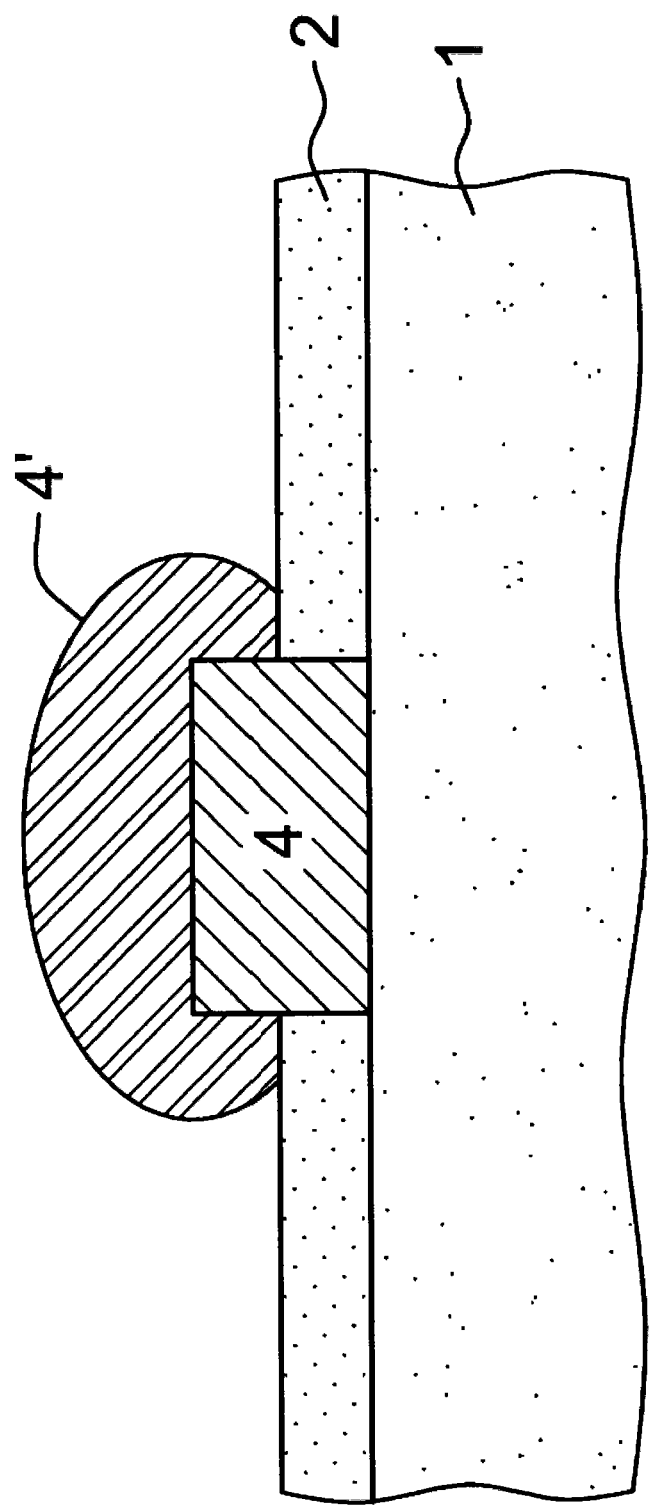
FIG. 2 shows that a metal contact line may be used as a seed layer to start plating an electrode to a desired thickness.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions, and/or arrangements within the spirit and/or scope of the underlying inventive concepts will be apparent to those skilled in the art from this disclosure.

The disclosed embodiments are directed to photovoltaic devices, including photovoltaic cells and modules containing a plurality of photovoltaic cells, and method for their manufacture. The photovoltaic cells can be used as monofacial cells which receive light at one surface or as bifacial cells which can receive light from the one surface and from an opposite surface.

An important parameter which affects the efficiency and output of a solar cell is an amount of area on a light-incident surface of the solar cell which is covered (directly) or shaded (by an angle of incident sunlight) by electrodes which are required to collect and move electrical current which is generated by the solar cells. The covered area and shading from electrodes may be reduced by decreasing the size of the electrodes. For example, electrodes are often formed as fingers, and decreasing the width of the electrode fingers increases the photoactive area available on the device for receiving and converting incident light.

In one example, conventional solar cell production may use screen printing technology to print electrodes on a front surface of a photovoltaic device with such a technique often using a metal paste (e.g., silver paste). This technique may result in a comparatively broad electrode line width (e.g., in excess of 50 um (typically about 100 um)), and a fairly low line conductivity of the metal grid due to the use of several non-metallic components (e.g., glass frit) in the printed paste. As indicated above, increased line width may result in increased shading and less light falling on the light-incident surface of the solar cell. In addition, a firing process may result in contamination of a substrate of the cell by ingredients of the metal paste, thereby reducing the energy conversion efficiency of the device. Moreover, some metal pastes (e.g., silver) may be comparatively expensive making them unfavorable as a primary electrode material.

FIGS. 3-16 show an example embodiment of the invention which uses a metal etch resist to form a metal grid pattern for e.g., a solar cell. It is understood that many techniques exist for the formation of a metal patterns on a substrate in accordance with the invention and that the sequence presented is only one possible example.

Initially, a substrate 1 is supplied. This substrate may be a silicon semiconductor wafer of either p or n-type doping. The substrate may be textured, for example with a random pyramid pattern to improve light trapping in the solar cell. The substrate may have dopant diffusions on either or both sides to form emitter structures or surface fields. Such dopant diffusions may be patterned, for example to form so-called selective emitter structures. The substrate may have thin film passivation layers present on either or both surfaces. Such passivation layers may for example consist of doped or intrinsic amorphous silicon layers, silicon dioxide, silicon nitride, doped or intrinsic poly-silicon, doped or intrinsic silicon carbide, aluminum oxide or any of a large variety of such passivation layers and combinations thereof.

Figure 3:
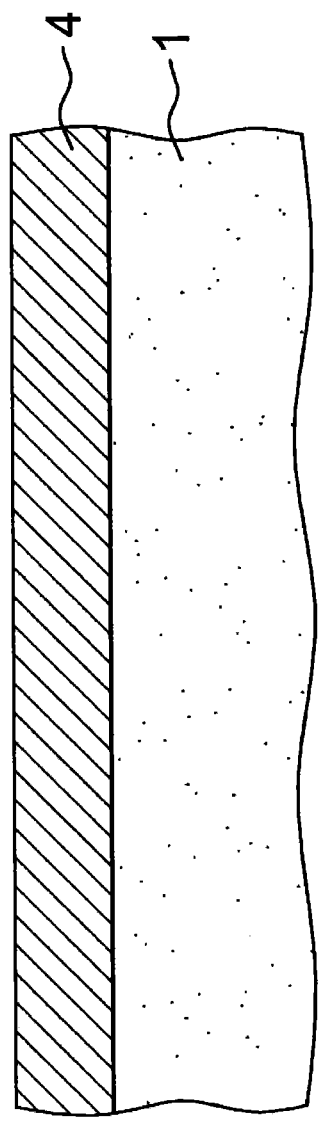
FIGS. 3-10 are schematic, partial cross-sectional views of a solar cell showing an example embodiment of the invention in which a metal etch resist is used to form a metal grid pattern for e.g., a solar cell, as follows.

A metal film 4 is deposited over a surface of the substrate, and the structure shown in FIG. 3 results, which shows a metal film 4 over substrate 1. Such metal deposition may, for example, be performed using well established techniques such as sputtering, thermal evaporation or e-beam evaporation. It is understood that this metal film may consist of multiple different metal layers where these metal layers are required to perform different functions. For example, a bottom—next to the substrate—metal layer may be required to form good electrical contact and adhesion to the substrate, a top or middle metal layer may be required to act as a diffusion barrier, and a top metal layer may need to function as an electroplating seed. Further, it is understood that the metal film may require specific properties, for example thickness and/or composition.

Figure 4:
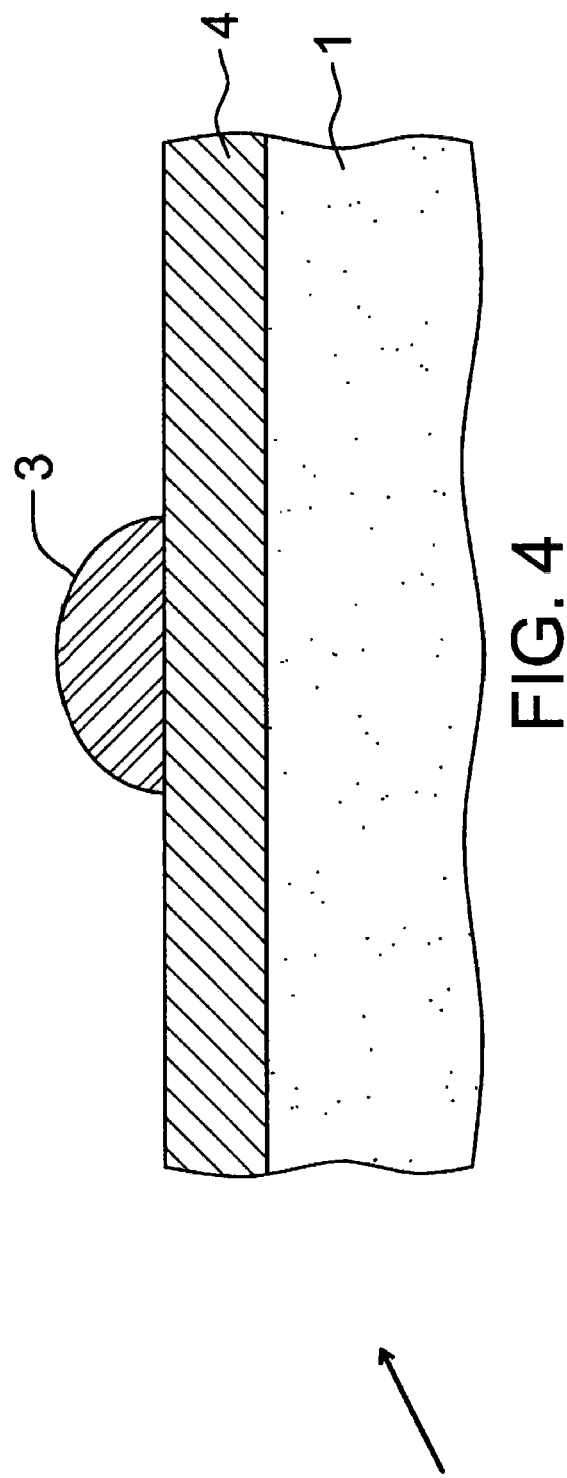
Figure 9:
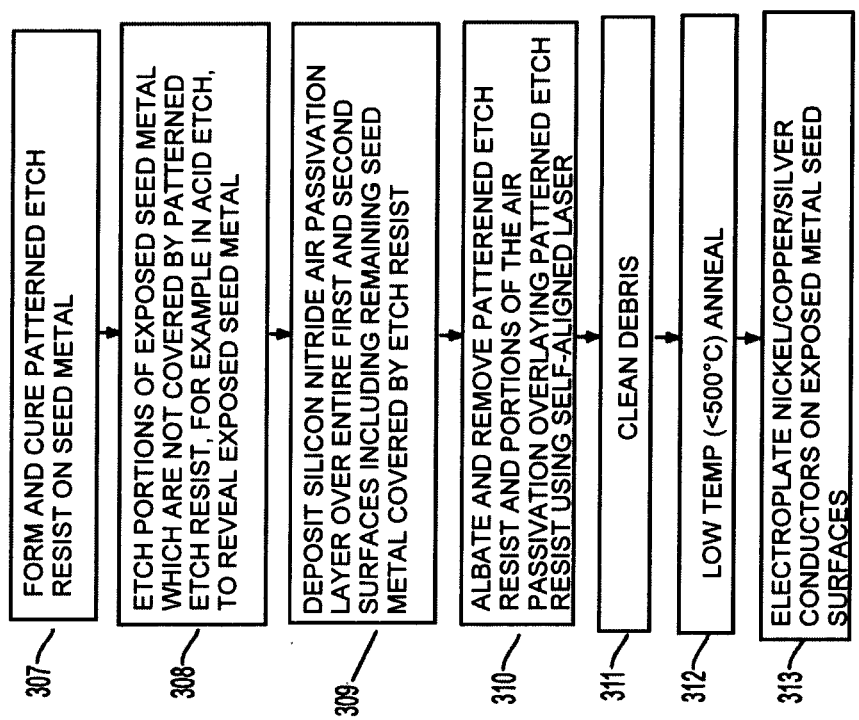

A patterned etch resist 3 (e.g., narrow resist line) may next be formed (e.g., using an ink jet printer) over metal film 4 to form a structure 155 as depicted in FIG. 4 and indicated as Step 307 in FIG. 9. Patterned etch resist 3 may be formed from well-known materials, such as commercially available inkjet printable resists configured to absorb a wavelength of a laser light source, and to be deposited in a pattern on metal film 4 of structure 155. In one embodiment, a resist pattern may include a pattern for later forming narrow conductive fingers and wider connective bus-bars extending transversely to the fingers. In one example, resist 3 may be a UV curable black or other colored ink resist which may absorb the wavelength of a laser light source. Before applying resist 3 (e.g., via printing), structure 155 depicted in FIG. 3 may be pretreated to reduce a surface energy of the metal film 4, making it a hydrophobic surface. Such pretreatment helps ensure that when the resist is applied (e.g., printed) the resist beads up on metal film 4 and does not spread out. The pretreatment may include a deposition of a monomer with a hydrophobic group with reactive chains which attach to a surface of metal film 4. Alternatively, a plasma treatment may be used for such pretreatment, or a monomer layer of molecules may be deposited as the surface treatment. In short, any surface treatment of metal film 4 which makes the surface hydrophobic or otherwise inhibits flow of a resist (e.g., resist 3) on a metal film (e.g., metal film 4) may be used. Resist 3 (FIG. 5) may be formed by any of various well-known techniques. In one embodiment, resist 3 (FIG. 4) may be formed by inkjet printing as indicated above. In another embodiment resist 3 (FIG. 4) may be formed by dispensing, spraying, screen printing or photolithographic techniques.

After resist 3 is printed on metal film 4, resist 3 on metal film 4 may be cured under UV light to pin resist 3 in position on metal film 4. Depending upon the particular resist material that is selected or used, it could be advantageous to use a low temperature curing process in the range of 70-150 C to drive out residual water, if present, from the resist and promote adhesion to the metal layer. After resist 3 is cured, metal film 4 may be etched. Patterned etch resist 3 protects portions of metal film 4 which are covered by patterned etch resist 3 during exposure of metal film 4 to a suitable metal etch solution, such as an acid solution (e.g., via a suitable metal acid etch solution, in step 308 of FIG. 9).

Figure 5:
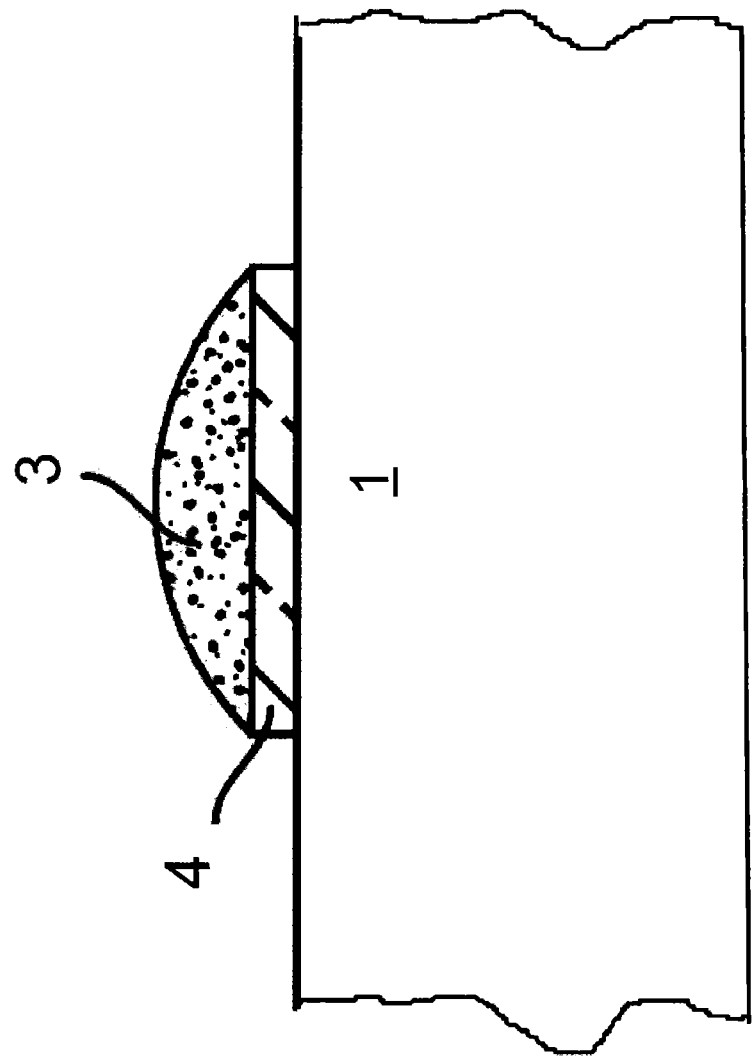

Etching of metal film 4 produces a structure 160, as shown in FIG. 5, which shows no undercutting of metal film 4 beneath the resist. However, depending on the etch conditions, the etching may provide a slight undercutting of metal film 4 beneath resist 3. In an example of metal film 4 being formed of a titanium and nickel/vanadium seed layer a two-step etch can be used. Nitric acid or iron chloride may be used to etch the nickel/vanadium layer and a hydrofluoric acid etch may be used to etch the titanium layer. Other etching solutions may also be used depending on the materials forming the resist (e.g., resist 3) and metal film (e.g, metal film 4).

Figure 6:
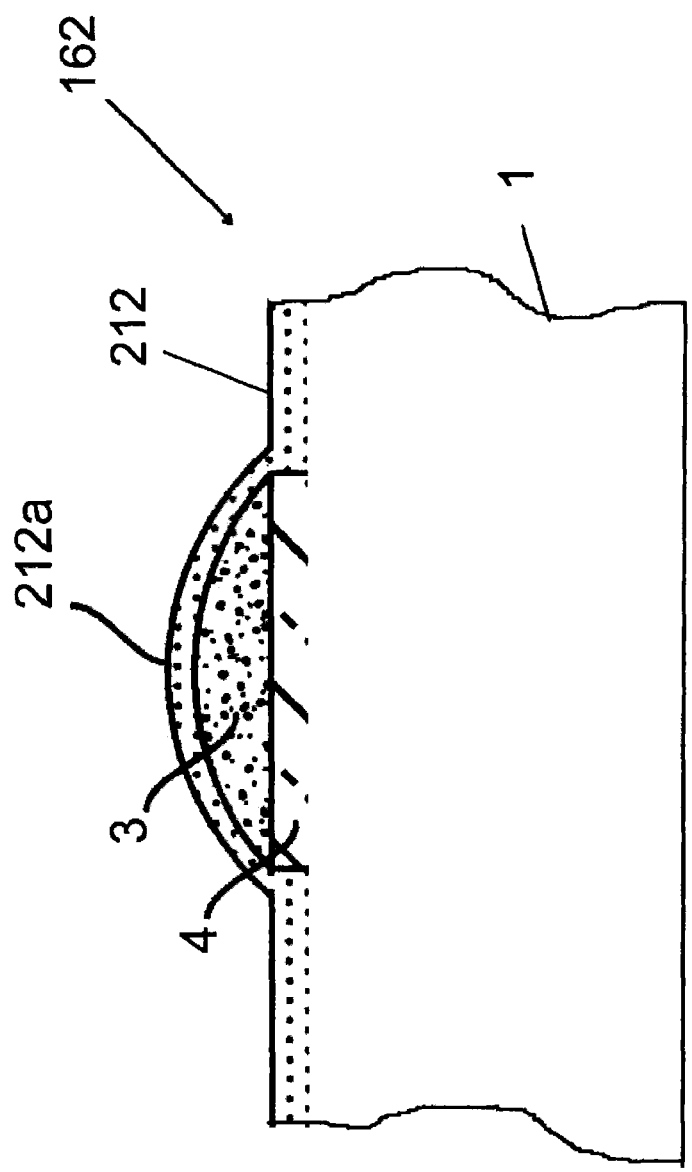

A material layer 212 which functions both as a passivation layer and antireflection coating, may next be formed on a front surface 162 on a structure 164, as depicted in FIG. 6 and indicated in Step 309 of FIG. 9. Alternatively, such a material layer (e.g., material layer 212) could be formed on surface 162 and a back surface (not shown) of substrate 1. The material layer could be formed of any dielectric material which has optical properties of an anti-reflective coating and can passivate substrate 1 and may be deposited using PECVD. As also shown in FIG. 6, material layer 212 (e.g., a dual-function passivation/antireflection layer) is deposited over any exposed etch resist (e.g., etch resist 3) and over substrate 1. Although FIG. 6 is not to scale and enlarged for clarity, it is understood that material layer 212 coats textured surfaces of substrate 1 while maintaining a texture pattern, i.e., material layer 212 retains the texture after deposition of material layer 212. Material layer 212 could be formed of silicon nitride which would allow the layer to act as a passivation layer and antireflection coating. Further, material layer 212 may also be formed of an undoped layer of silicon carbide (e.g., as an anti-reflection coating and as a passivation layer). In another embodiment (not shown), a material layer may be applied as described above but which would not perform both antireflection and passivating functions. For example, titanium oxide may be utilized as such a layer which provides an antireflection coating only.

Figure 7:
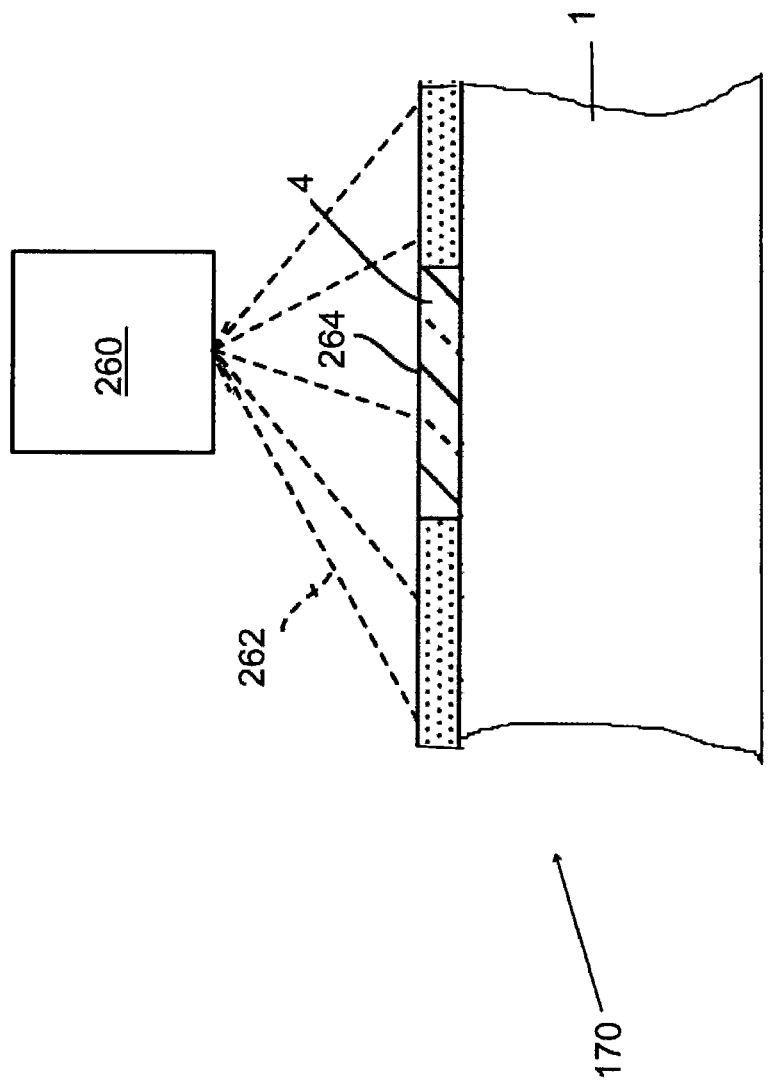

After material layer 212 is applied, etch resist 3 and a portion 212a (FIG. 6) of material layer 212 over etch resist 3 may be removed as depicted in FIG. 7 and indicated in Step 310 of FIG. 9. Such removal may be performed via any of various methods which breaks, dissociates, or otherwise allows portion 212a and a portion of resist 3 to be removed from a surface 264 of metal film 4.

In one embodiment, the described removal may be accomplished with a laser 260, as shown in FIG. 7. For example, a laser beam 262 (FIG. 7) emitted by laser 260 may have a wavelength which is configured to heat and expand the patterned etch resist (e.g., etch resist 3), while none of the other materials or components of the device are significantly affected. Because laser beam 262 (FIG. 7) interacts with patterned etch resist 3 (FIG. 6) only, the laser beam is considered to be self-aligned to resist 3 (FIG. 6).

More specifically, laser 260 may emit a laser beam 262 (or multiple laser beams 262) having a wavelength which passes through portion 212a of material layer 212 remaining over resist 3 and which is absorbed by etch resist 3. Irradiation by laser 260 may thus heat resist 3 causing it to expand, crumble and dissociate from surface 264 of metal film 4 while the other materials or components of the device are not significantly affected. Portion 212a overlying resist 3 may be brittle, and thus the laser may cause portion 212a to break apart and flake off. Any portion of the laser beam which passes through resist 3 may also reflect off surfaces 264 of the metal film 4 and back into resist 3 further facilitating heating of resist 3. The surfaces of substrate 11 (FIG. 7) may be completely irradiated by the laser at the same time, progressively, or in portions corresponding to the locations of patterned etch resist 3 (FIG. 1G), for example.

As indicated, laser 260 may emit laser beam 262 which may have a wavelength which interacts preferably with patterned etch resist 3, causing patterned etch resist 3 to crumble and portion 212a of the material layer 212 overlying the etch resist to break apart and flake, resulting in an ablated structure 170 as shown in FIG. 7. Structure 170 may be completely irradiated by the laser at the same time, progressively, or in portions corresponding to the locations of resist 3 (FIG. 6), for example. Laser 260 may be a 1064 nm laser, for example. During use, the laser may scan a surface (e.g., portion 212a) with rectangular laser spots forming a laser beam (e.g., laser beam 262) having a size of about 2×2 mm without an overlap of the rectangles. A small gap up to 50 microns (urn) may exist between such rectangle (s) to avoid the laser beam (e.g., laser beam 262) hitting a spot twice. After the resist (e.g., resist 3) is removed, any contact by the laser beam (e.g., laser beam 262) with an underlying portion (e.g., metal film 4) may be detrimental to such underlying portion such that it is desirable to avoid multiple applications of the laser at a particular location and to avoid the laser beam contacting the metal film after removal of the resist.

Further, although the process is described relative to structure 155, the process of forming a metal film (e.g., metal film 4), forming an etch resist (e.g., etch resist 3) on the metal film, forming a dielectric layer (e.g., material layer 212 forming an antireflection and/or passivation layers) and utilizing a laser to remove a portion of the resist may also be utilized on other solar cell structures having substrates formed differently than that described relative to structure 155.

Figure 11:
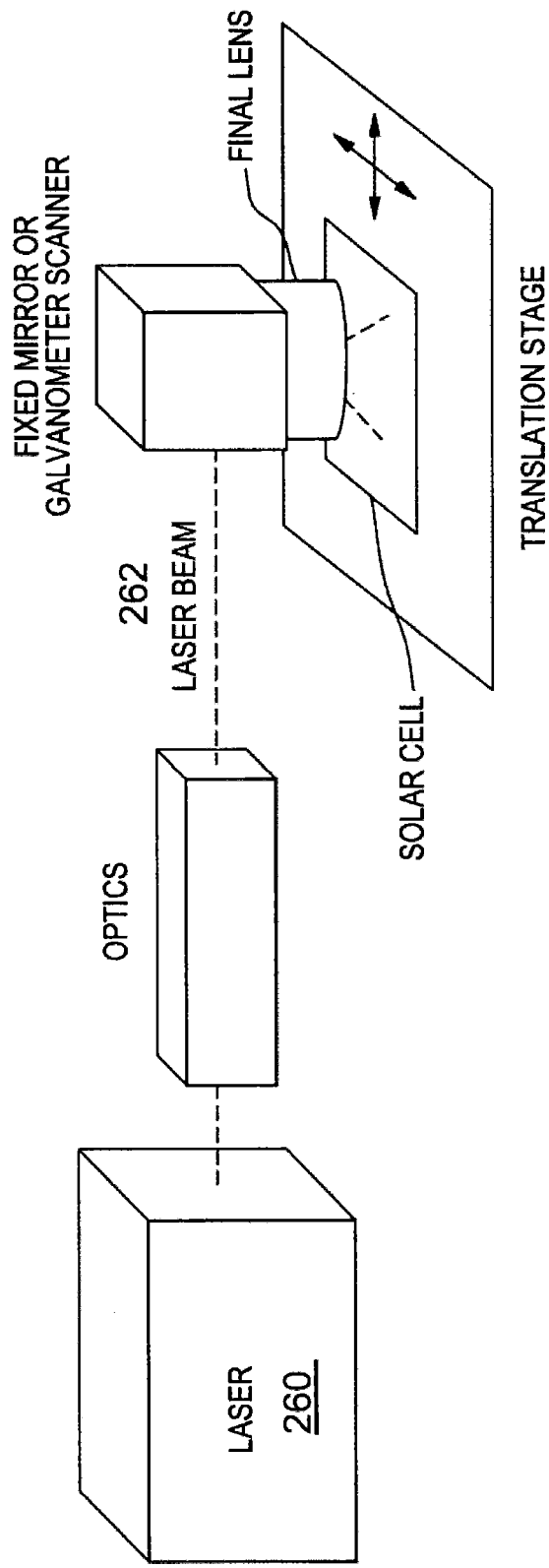
FIG. 11 shows a simplified diagram of a laser machining system suitable for performing the laser processing of the present invention.

FIG. 11 shows a simplified diagram of a laser machining system suitable for performing the laser processing in accordance with the present invention. Laser beam 262 may be generated in laser 260. The laser beam is fed through optional external optics which may include components such as a beam expander, beam collimator, beam homogenizer, imaged mask, fiber beam delivery system, variable attenuator, relay lenses and mirrors. A galvanometer scanner and/or a translation stage may be used to translate the laser beam to cover the substrate e.g., for a solar cell. The final lens is used to focus the beam onto the substrate e.g., for a solar cell. Such a laser machining system arrangement, as illustrated in FIG. 11, is readily available and applicable to high throughput industrial applications such as solar cell manufacturing.

Figure 12:
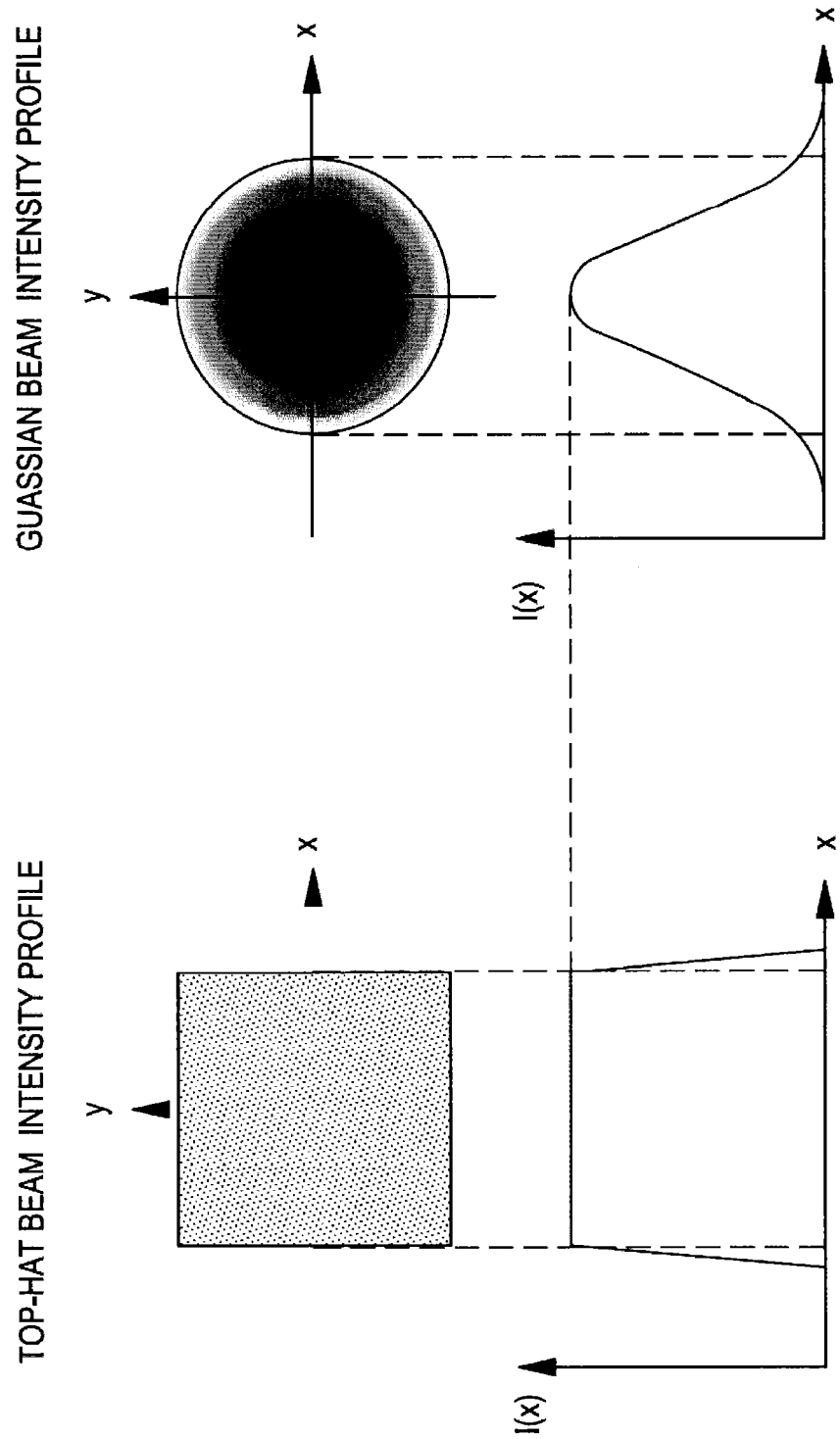
FIG. 12 shows an example of two applicable beam intensity power density or fluence profiles in accordance with the present invention.

This invention may use different laser beam intensity profiles. FIG. 12 shows an example of two applicable beam intensity (power density or fluence) profiles.

A Gaussian beam profile, or close to Gaussian, is one typically generated by many laser sources, the intensity distribution in any transverse plane is a circularly symmetric Gaussian function centered about the beam axis. An alternative beam profile shown is the so-called "Top-Hat" or "Flat-Top" beam profile. Such a profile ideally has a near-uniform intensity within the exposure area. The Top-Hat exposure area shape may be circular, square, rectangular or any shape generated by appropriate optics. Such a Top-Hat beam profile is typically generated using special diffractive or refractive optics, or multimode fibers, called beam shapers. Either of these profiles or combinations or variations thereof may be used for laser processing according to the present invention.

Figure 13:
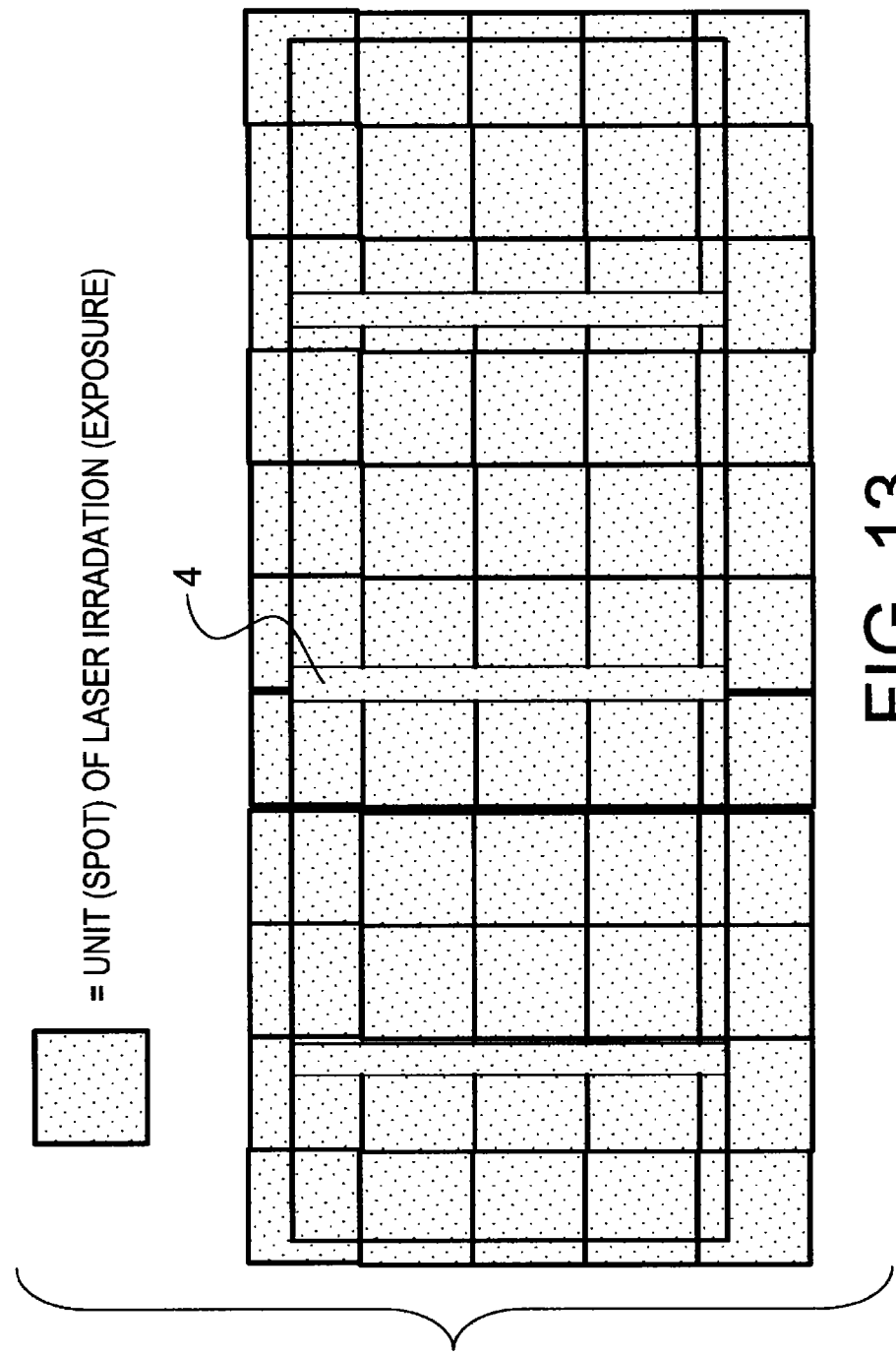
FIGS. 13 and 14 show examples of how a square top-hat beam profile may be scanned or translated over a substrate, in a process for the self-aligned selective laser ablation of dielectric coating overlying a patterned metal film, in accordance with the present invention.
Figure 14:
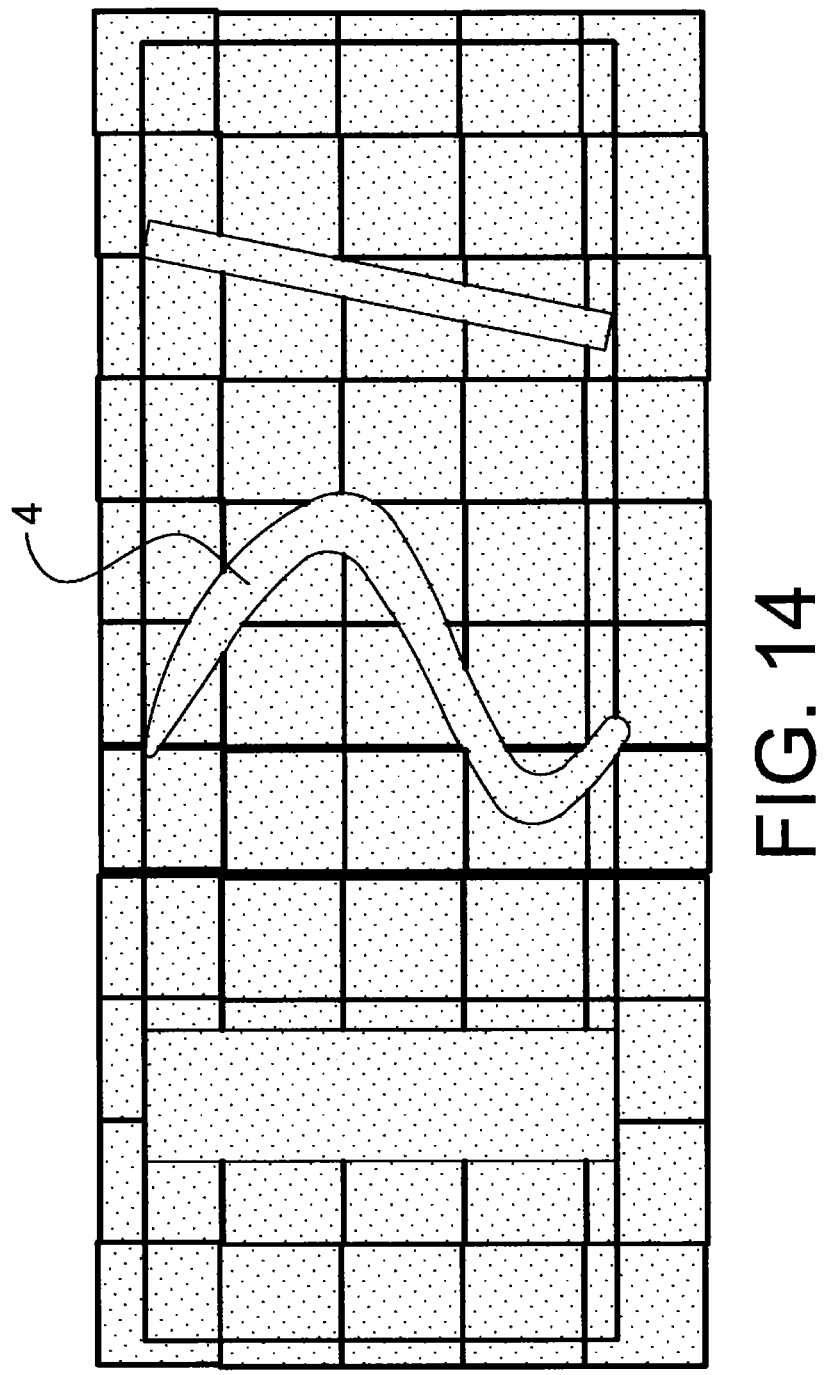

FIGS. 13-14 show examples of how a square top-hat beam profile may be scanned or translated over a substrate, in a process for the self-aligned selective laser ablation of dielectric coating overlying metal film 4. As can be seen, this process is tolerant to variations in the size, placement and shape of the narrow metal fingers. It is understood that a variety of different beam scanning, overlap and placement schemes are applicable to this invention and that the two shown are only representative examples of the general principle.

FIGS. 13-14 show an example of full area laser irradiation using a square top-hat profile laser beam spot. The square spot is scanned or translated to cover the entire process area. As can be seen from FIG. 14, for a self-aligned selective laser ablation process removing a dielectric coating overlying etch resist 3 on metal film 4, this irradiation pattern functions irrespective of the size, position or shape of etch resist 3.

Figure 15:
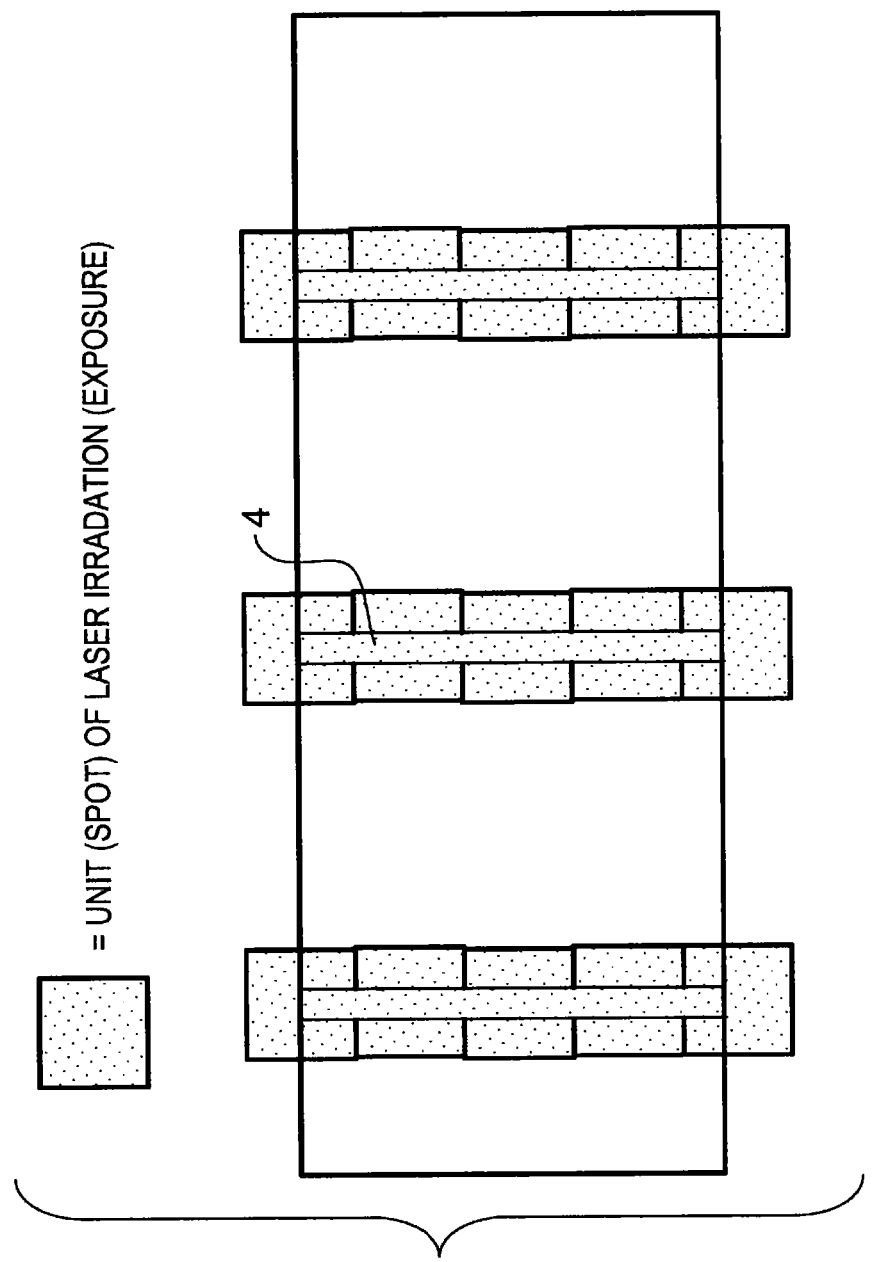

FIGS. 15-16 show an example of aligned laser irradiation pattern using a square top-hat profile laser beam spot. The square spot is scanned or translated to cover metal film 4 (e.g., narrow metal fingers). As can be seen from FIG. 16, for a selective laser ablation process removing a dielectric coating overlying etch resist 3, this irradiation pattern does not need to accurately track variations in the size, position or shape of etch resist 3.

Any debris associated with the breakdown of resist 3 and overlying portion 212a of material layer 212 may be removed for example, by blowing any debris away using a suitable blower as indicated, for example, in Step 311 of FIG. 9. A water-based detergent or solvent-based spray may optionally further be used to clean structure 170 depicted in FIG. 7.

Following the cleaning of structure 170 described above and depicted in FIG. 7, a low temperature anneal may be conducted with a relatively low temperature of less than or about 500° C. to promote adhesion of metal film 4 to substrate 1 and a good electrical contact as indicated in Step 312 of FIG. 9. This anneal can be done, for example, in a temperature range of about 250° C. to about 500° C. As one specific example, the anneal can be accomplished at a temperature of about 375° C. for about 2 minutes. This low temperature anneal can also reduce defect damage to the semiconductor layers of substrate 1 which may have occurred during deposition of metal film 4. The anneal may be conducted in an atmosphere having a very low concentration of oxygen to avoid oxidation of surface 264 which might make it hard to later electroplate. Typically, the atmosphere will contain less than 100 ppm of oxygen, and preferably less than 20 ppm of oxygen. The anneal atmosphere can be a nitrogen atmosphere ($N_2$) with a small amount of a forming gas, such as hydrogen. The forming gas utilized may be dependent upon a type of material/metal being used (e.g., metal film 4) to avoid oxidation or other un-desirable characteristics of such material/metal. The forming gas may be in a concentration of about 0 to about 5% by volume, for example, 4%. The forming gas may further help reduce oxidation of surface 264.

Figure 8:
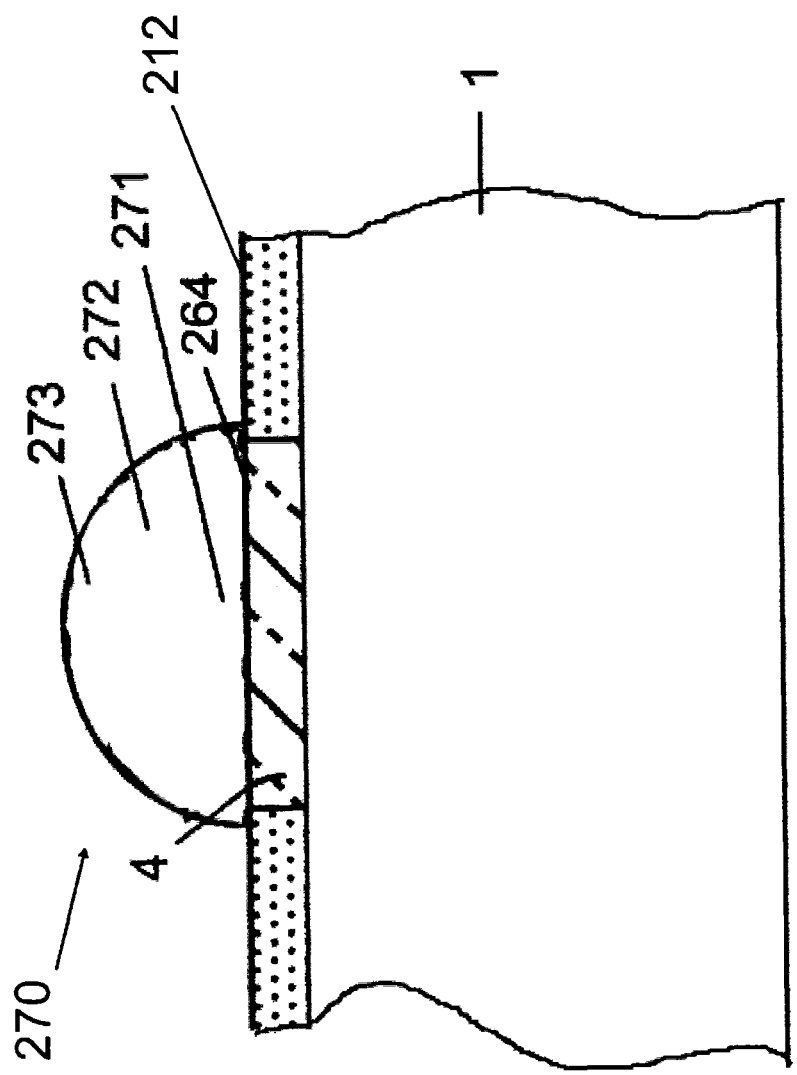

As shown in FIG. 8, a conductor 270 may next be formed on metal surface 264. Conductor 270 may be formed from one or a plurality of conductive materials, for example metals such as nickel, copper, silver, titanium, vanadium, tin or any combination thereof. The conductor may be applied to surface 264.

In one embodiment, conductor 270 may include a metal stack comprising a layer of nickel applied to surface 264, a layer of copper electroplated to the layer of nickel, and a layer of silver electroplated to the layer of copper as indicated, for example, in Step 313 of FIG. 9. Conductors 270 may be formed by electroplating on the seed metal surface. The electroplating occurs on all exposed surfaces (e.g., surface 264) of the metal film 4 (i.e., not on areas of material layer 212). Accordingly, any undercutting of the metal film 4 which may have occurred during etching of the metal film 4 (FIG. 5) described above may be filled during the plating process (not shown). An electroless deposition may also be used to produce conductors 270. In an example, conductor 270 may be formed of a nickel, copper, silver conductor stack. A nickel portion 271, a copper layer portion 272, and a silver portion may be isotropic plated onto conductor 270.

Figure 10:
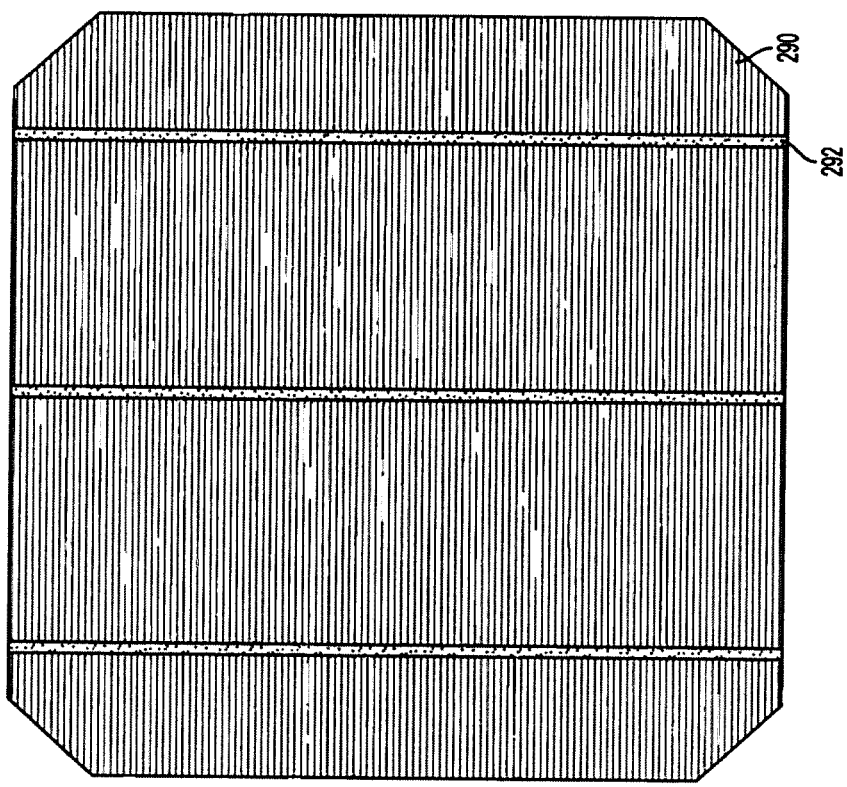

Using the techniques described above very narrow finger and bus bar conductors may be produced. For example, conductive fingers 290 and bus bars 292 may be formed as described above for conductor 270. As shown in FIG. 10, conductive fingers 290 may have a width in a range of about 40 um to about 60 um and a height in a range of about 5 um to about 20 um and may be spaced on a pitch in a range of about 0.2 mm to about 2.5 mm. Transverse bus bars 292 may have a width in a range of about 0.5 mm to about 2.5 mm, a height in a range of about 5 um to about 20 um and may be spaced from one another by about 52 mm. Finger conductors 290 and bus bar conductors 292 allow more light into a substrate (e.g., substrate 1) for photo conversion and the short height described reduces shading of light hitting such a substrate.

A number of embodiments have been described and illustrated. Nevertheless, it will be understood that various modifications may be made without departing from the spirit and scope of the invention, which is defined solely by the scope of the appended claims.

The invention claimed is:

1. A method for use in forming a photovoltaic device, comprising:
    forming a metal film on a doped semiconductor;
    forming a patterned etch resist on the metal film;
    etching the metal film;
    forming a dielectric layer on the doped semiconductor and the etch resist such that a first portion of the dielectric layer is directly on the etch resist and a second portion of the dielectric layer is directly on the doped semiconductor; and
    applying a laser to the first portion and the second portion, the laser having a wavelength absorbable by the patterned etch resist through the dielectric layer to the patterned etch resist, the laser removing the patterned etch resist and the first portion of the dielectric layer, the laser heating the etch resist to cause the etch resist to expand and crumble and the first portion of the dielectric layer breaking apart in response to the expanding and crumbling of the etch resist.

2. The method of claim 1 further comprising pretreating the metal film prior to the forming of the patterned etch resist to make the metal film hydrophobic.

3. The method of claim 1 wherein the forming the etch resist further comprises curing the etch resist to pin the etch resist in a position on the metal film.

4. The method of claim 1, further comprising annealing the metal film after the patterned etch resist and the first portion of the dielectric of the layer are removed.

5. The method of claim 4, wherein the anneal is conducted at a temperature less than 500° C.

6. The method of claim 5, wherein the anneal is conducted at a temperature in the range of about 250° C. to about 500° C.

7. The method of claim 4, wherein the anneal is conducted for about 5 minutes.

8. The method of claim 1, further comprising forming a conductor on the metal film by electroplating.

9. The method of claim 8 wherein the forming the conductor comprises repairing an undercut in the metal film.

10. The method of claim 8, wherein the conductor is formed by electroless deposition.

11. The method of claim 8, wherein the conductor is formed by an electroplated sequential deposition of nickel, copper and silver.

12. The method of claim 1, wherein the wavelength comprises a wavelength of about 1064 nm.

13. The method of claim 1, wherein the laser beam comprises a plurality of non-overlapping laser spots.

14. The method of claim 1, wherein the laser spots are spaced from each other by up to 50 micrometers.

15. The method of claim 1, wherein the forming the dielectric layer comprises forming an antireflection layer or a passivation layer.

* * * * *